US009060460B1

(12) United States Patent
Friga, Jr.

(10) Patent No.: US 9,060,460 B1
(45) Date of Patent: Jun. 16, 2015

(54) COMPUTER AND ELECTRONICS ASSEMBLY MAT (71) Applicant: Mark Friga, Jr., Webster, NY (US)

(72) Inventor: Mark Friga, Jr., Webster, NY (US)

(73) Assignee: FROZENCPU.COM, East Rochester, NY (US)

( * ) Notice: Subject to any disclaimer, the term of this patent is extended or adjusted under 35 U.S.C. 154(b) by 279 days.

(21) Appl. No.: 13/833,489

(22) Filed: Mar. 15, 2013

(51) Int. Cl.
H05K 13/00 (2006.01)

(52) U.S. Cl.
CPC ................................. H05K 13/0053 (2013.01)

(58) Field of Classification Search
CPC ................................................ H05K 13/0053
USPC ........................................................ 269/289
See application file for complete search history.

(56) References Cited

U.S. PATENT DOCUMENTS

| 4,784,908 | A | * | 11/1988 | Ungar et al. | 428/332 |
| 4,992,335 | A | * | 2/1991 | Guerra et al. | 428/518 |
| 7,418,787 | B2 | * | 9/2008 | Chen Lin | 33/573 |
| 7,665,719 | B2 | * | 2/2010 | Kishbaugh et al. | 269/289 R |
| 2001/0022419 | A1 | * | 9/2001 | Herren | 269/289 R |
| 2009/0167546 | A1 | * | 7/2009 | Yang | 340/649 |
| 2009/0290279 | A1 | * | 11/2009 | Rodgriguez et al. | 361/220 |
| 2011/0101589 | A1 | * | 5/2011 | Engel | 269/296 |
| 2011/0227738 | A1 | * | 9/2011 | McIlroy et al. | 340/573.1 |
| 2013/0099438 | A1 | * | 4/2013 | Mann | 269/8 |
| 2014/0131231 | A1 | * | 5/2014 | Linder et al. | 206/232 |
| 2014/0248113 | A1 | * | 9/2014 | Phillips | 414/800 |

* cited by examiner

Primary Examiner — Lee D Wilson
Assistant Examiner — Marc Carlson
(74) Attorney, Agent, or Firm — John G. Fischer, Esq.; Paul D. Lein, Esq.; Scheef & Stone, L.L.P.

(57) ABSTRACT

The present invention relates to an improved anti-static computer assembly mat having multiple grounding points between the mat and other bodies capable of transmitting or receiving electrostatic discharge (ESD) during the assembly process. The grounding points may be connected to a computer chassis, a system builder, or a grounded outlet to ground the assembly mat and components thereon. The assembly mat has a relatively large assembly area such that a system integrator or builder may be able to place multiple components on the anti-static work surface at the same time while simultaneously preventing surface blemishes to system components. Further, the present invention provides for a wide variety of computer component measurements to assist the system builder in selecting and installing components during the build process. Such measurements may include rulers, motherboard sizing, CPU socket sizing, hard drive thread spacing, fan hole spacing, tubing size, power supply connectors, among other items.

15 Claims, 5 Drawing Sheets

COMPUTER AND ELECTRONICS ASSEMBLY MAT

FIELD OF THE INVENTION

The present invention relates generally to an apparatus for assembly of electronic equipment, and more specifically to a mat for the assembly of a computer thereupon.

BACKGROUND

In the area of computer and electronic component assembly, a common problem encountered by many system builders during the building, disassembly or upgrading of a computer is the danger posed by electrostatic discharge or (ESD). Such static electricity may be transferred from a system builder to the electronic component or components such as CPUs, memory modules, hard disk drives, video cards, and other delicate parts being assembled. In many cases, a system builder may assemble the components for a computer system in a location that lacks ESD protection, such as in a carpeted room or on an unshielded table. This is especially problematic where the system builder is located in an area of relatively low humidity, such as colder climates, and places where indoor heaters or furnaces are frequently used. The problem of ESD is further exacerbated by the use of carpeting in many homes and other indoor locations, as well as the soles of certain types of footwear.

As a result, a system builder may unknowingly build up a relatively significant amount of static electricity without his or her knowledge. Such a buildup of electricity over time may result in storage of charge large enough to cause damage to sensitive electronic components. Even when a system builder periodically grounds himself or herself, the buildup of static electricity is an ongoing process. In some instances, the buildup of static electricity is substantial enough such that contact with an electronic component is not required to transfer ESD to the component; merely being in close proximity will be sufficient.

Thus, during the computer assembly process, a system builder may unknowingly transfer ESD from his or her body to the electronic components being assembled. The discharge of ESD from the system builder to the electronic component during assembly of a computer may not appear to pose any problem at first. However, minor damage may have already resulted to the component as a result of a shock due to ESD. Symptoms of damage from ESD may be difficult to diagnose and while the component may operate as intended, the part may be subject to issues such as occasional system lockup to degrading to a point where the part subsequently wears out and/or fails prematurely. In more serious instances, the initial ESD may be sufficient to render the component inoperable prior to use.

Another problem commonly encountered by system builders are computer chasses which have sharp or otherwise unfinished edges. This may be particularly prevalent on interior surfaces, and in instances where the chassis has been cut or punched-out. Sharp edges may also be found on certain other components such as video cards, expansion cards, and other high-end cooling components. Such edges may scratch or otherwise damage the surface of a table or other work area. Conversely, the hard surface of a table may introduce shock or otherwise scratch the surface of certain components, in particular those components the system builder values for their aesthetic appeal. Such components may have polished chrome or satin metal finishes and may include hard disk drives, video cards, other expansion cards, and liquid based cooling solutions.

As a result, many system builders utilize anti-static mats made from ESD resistant material such as latex rubber. Such electronics assembly mats provide for a large ESD resistant surface for which a system builder may assemble or disassemble computer components without fear of damaging the components through ESD. Such assembly mats may also provide grounded connections for anti-static transmission cables meant to properly ground the system builder. The cables may connect the anti-static mats to the system builder as well as connect to the frame of a computer chassis to fully ground the system builder and anti-static mat. Through the use of these assembly mats, a significant amount of risk due to ESD may be alleviated during the assembly process.

Furthermore, the soft flexible surfaces of the assembly mats provide for a protective surface for the components, thereby preventing aesthetic damage to the assembly mats and/or the table and other work surfaces upon which the assembly process may occur. The assembly mat further provide protection to the aesthetic appearance of the system components being installed or assembled.

However, while such computer assembly mats have been available for some time, these mats typically do little beyond providing grounding to the system components and the system builder. Further, many currently available mats are relatively small in size and do not provide a system builder with the necessary freedom of movement to effectively and comfortably assemble electronic components. Additionally, such presently available anti-static computer assembly mats fail to provide easy to use measurements for a builder to reference during the assembly process, thereby causing delay and confusion in the correct part usage and placement during the assembly process.

Further, a system builder may need to leave the vicinity of the assembly mat for a number of purposes, such as to retrieve additional components or tools. When a system builder leaves the assembly area, he/she must disconnect the anti-static wrist strap, thereby becoming ungrounded in the process. Even a brief departure is sufficient for a person to build up static electricity that could potentially damage electronic components upon the person's return to the assembly of computer components. Because anti-static assembly mats only provide ESD protection to components placed on the surface of the assembly mat, and only when the system builder has been properly grounded via a wrist strap, it is desired that such trips from the assembly mat area be minimized to the extent possible.

SUMMARY OF THE INVENTION

What is therefore needed is an improved anti-static computer assembly mat which provides for these features. The present invention provides an anti-static computer and electronics assembly mat having multiple grounding points between the mat and other bodies capable of transmitting or receiving ESD during the assembly process. The present invention further provides for a relatively large assembly area such that a system integrator or builder may be able to place multiple components on the anti-static work surface at the same time while simultaneously preventing surface blemishes to system components.

Further, the present invention provides for a wide variety of computer component measurements to assist the system builder in selecting and installing components during the build process. In particular, the present invention provides for several different reference measurements not generally available on prior art assembly mats, which are particularly tailored for system builders wishing to build customer computer assemblies, and/or include more exotic cooling systems such as water cooling. The anti-static assembly surface provided by the present invention additionally prevents scratching or otherwise blemishing the appearance of expensive components such as specialized fans, tubing, and radiator equipment, many of which have been purchased by system builders with overall aesthetic appearance in mind.

Additionally, by providing a large work surface as well as all necessary reference measurements, the present invention minimizes the number of trips that a system builder must make from the assembly area. This reduces the opportunities for the system builder to acquire static electricity, and potentially damages components through ESD upon their return to the work area.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
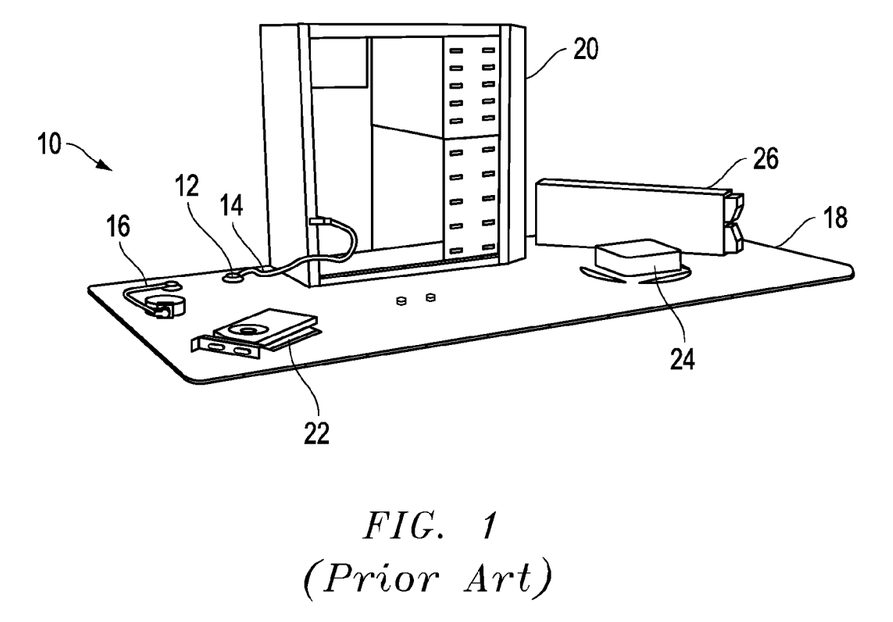
FIG. 1 is a perspective view of a prior art assembly mat having a computer chassis and other components located thereon.

Turning to FIG. 1, a presently available computer assembly mat 10 is shown therein. The prior art assembly mat 10 is made from a flexible, anti-static material, such as latex rubber. The assembly mat 10 may be rolled up for ease of storage and unfurled before use. As shown in FIG. 1, computer and electronic components may be placed on the mat 10 during the assembly process, which minimizes the potential danger posed by ESD. As can be seen in this figure, the assembly mat 10 additionally provides one or more grounding points 12 for which a grounding wire 14 may be attached. The opposite end of the grounding wire may provide for connection to a computer chassis 20 via a clip, or may be connected to the system builder via a bracelet 16 worn on the wrist. Various electronic and computer components, such as video cards 22, hard drives, fans 24, expansion cards 26, etc. may also be safely placed on the assembly mat 10 without danger of ESD, and the system builder is free to move about the workspace provided for by the mat 10 during assembly.

Figure 2:
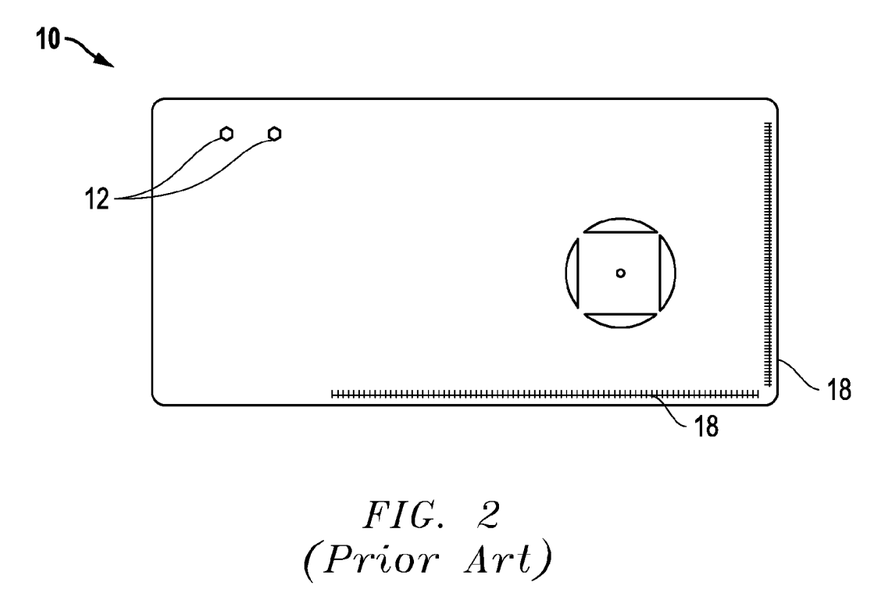
FIG. 2 is a top down view of a prior art assembly mat alone.

Next, at FIG. 2, a top down view of a prior art assembly mat 10 is shown. The assembly mat 10 is shown with grounding connectors 12 as in FIG. 1. Further, it may be seen here how simple measurements, such as ruler measurements 18 may be provided to assist the system builder during the assembly process.

Figure 3:
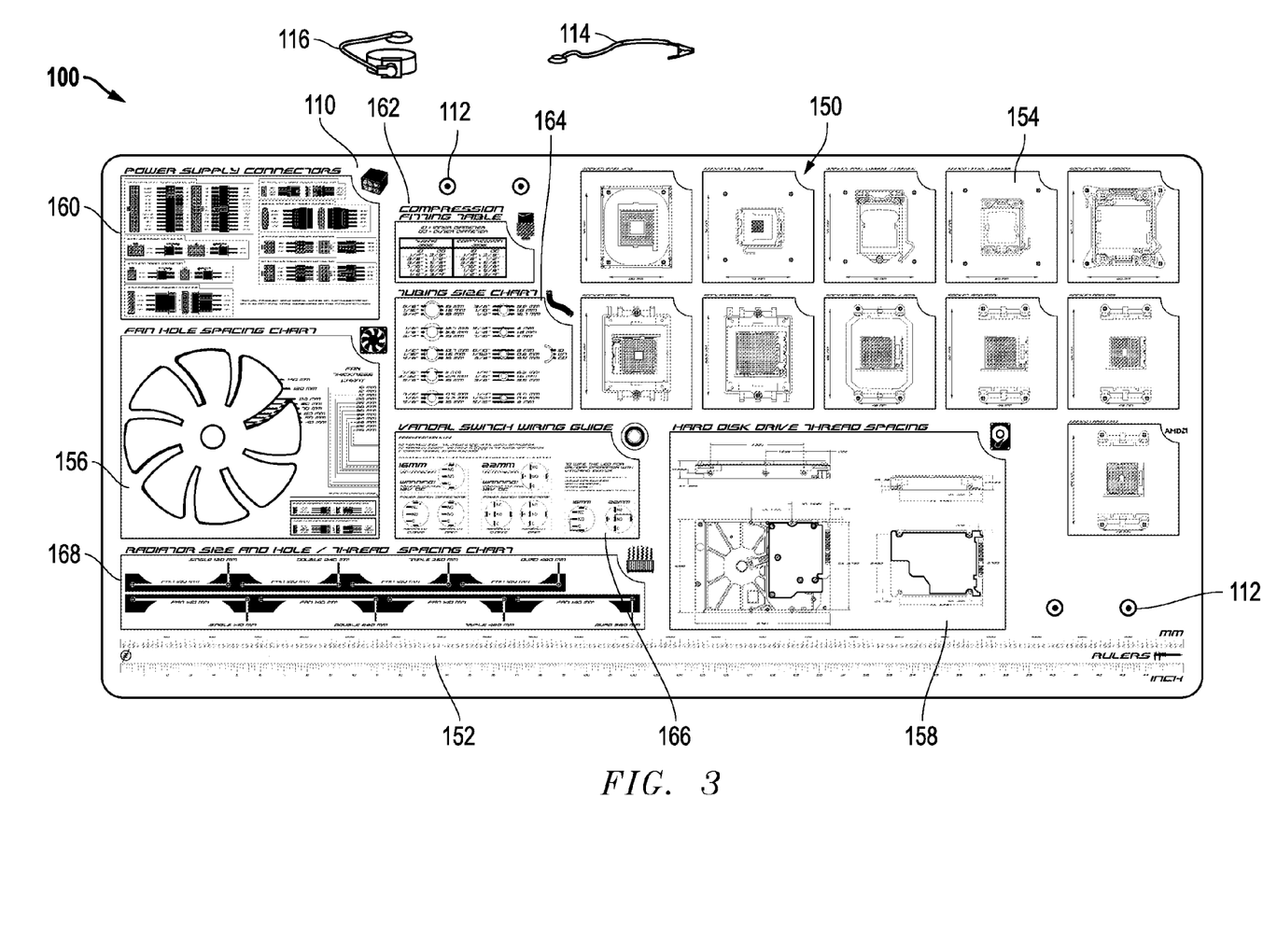
FIG. 3 is a top down view of an assembly mat according to an embodiment of the present invention.

In FIG. 3, a top down view of an embodiment of an assembly mat 100 of the present invention is shown. The assembly mat 100 has a flexible upper surface 110 and a flexible lower surface 120 (not seen), with the surfaces 110 and 120 connected to each other via an adhesive. The upper and lower surfaces 110, 120 are comprised of a flexible anti-static material which provides superior protection against ESD as well as providing a safe place to put system components during the assembly process. In one embodiment, the flexible surfaces 110 and 120 are fabricated from a latex rubber. In a preferred embodiment, the upper surface 110 is comprised of nitrile rubber, styrene butadiene rubber, an anti-static agent, and an accelerant. In another preferred embodiment, the lower surface 120 is comprised of styrene butadiene rubber, conductive carbon black, and an accelerant. The upper surface 110 may measure approximately 0.4 to 0.6 mm in thickness with the lower surface 120 measuring approximately 1.4 to 1.6 mm in thickness.

In another preferred embodiment, the lower surface 120 is comprised of a material having a coefficient of friction greater than 1.0 as to between the lower surface and a surface having the same material. This ensures that the lower surface 120 of the mat maintains a secure and firm connection to a work surface such as a table or work bench. This is important, as a loose connection between the assembly mat 100 and a work surface may result in possible damage to electronic components and/or the system builder. Further, the flexible surface material is fabricated so as to not scratch or otherwise cause blemishes to the various system components, such as more exotic video cards and air/water cooling devices where aesthetic appeal is important to the system builder and/or end user.

Together, the upper surface 110 and lower surface 120 provide superior protection against ESD. For instance, the assembly mat 100 may provide up to $10^8 \Omega$ of protection under SJ/T10694-2006, $10^4 \Omega$ of protection under SJ/T10694-2006, and $5.89 \times 10^6 \Omega\text{-}8.64 \times 10^6 \Omega$ of protection under GB/T14437-97. Moreover, the ESD protection provided by the assembly mat 100 varies minimally due to thermal changes.

As with the prior art assembly mat 10, the assembly mat 100 provides for one or more grounding points 112 for connecting grounding wires to the computer chassis during the assembly process, as well as for connection to a physical grounding point, such as a wall outlet. As can be seen in the present figure, a grounding clip 114 for attachment to a computer chassis and/or a grounding bracelet 116 may be connected to the grounding points 112. Through the use of the grounding wires 114, 116, the assembly mat 100, computer chassis, and system builder may remain fully grounded during the entire assembly process. It is important that the system builder maintain constant grounding, as while a system builder may initially ground himself or herself prior to beginning work, the system builder may accumulate additional static electricity within his or her body during the assembly process. Even over a short period of time, sufficient static electricity may be built up to provide a damaging ESD to the computer system and system components.

Remaining on FIG. 3, the assembly mat 100 may additionally provide a wide variety of component measurement references 150 which assist the system builder during the assembly process. Such references 150 may include basic measurements such as a ruler 152 having both English and metric measurements, as well as several other references that a system builder may find useful. By way of example, the assembly mat 100 may further include a processor socket guide 154, a fan hole spacing chart 156, a hard disk drive thread spacing guide 158, power supply connector chart 160, a compression fitting table 162, a tubing size chart 164, a vandal switch wiring guide 166, and a radiator size and hole spacing chart 168. It is important to note that the reference measurements shown are for illustrative purposes only, and that various other types of measurement references 150 may be contemplated within the scope of the present invention. Furthermore, the positioning and layout of the references 150 may be rearranged and reordered without adversely affecting the overall utility of the present invention.

The placement of various charts and reference guides conveniently on the surface of the assembly mat 100 allows for the system builder to adequately identify and assemble the components without separation from the grounding strap and/or mat itself. These conveniently located information identifiers create a non-removal environment for the system builder to work from, thereby minimizing any opportunity for static electricity buildup. That is, having these options present on the assembly mat 100 eliminates the need to leave the assembly area to measure or gather important assembly information elsewhere which increases the risk of collective ESD and further decreasing the efficiency of the assembly operation. As a result, components are protected from ESD via the grounding strap and/or assembly at all times during assembly process.

Figure 3A:
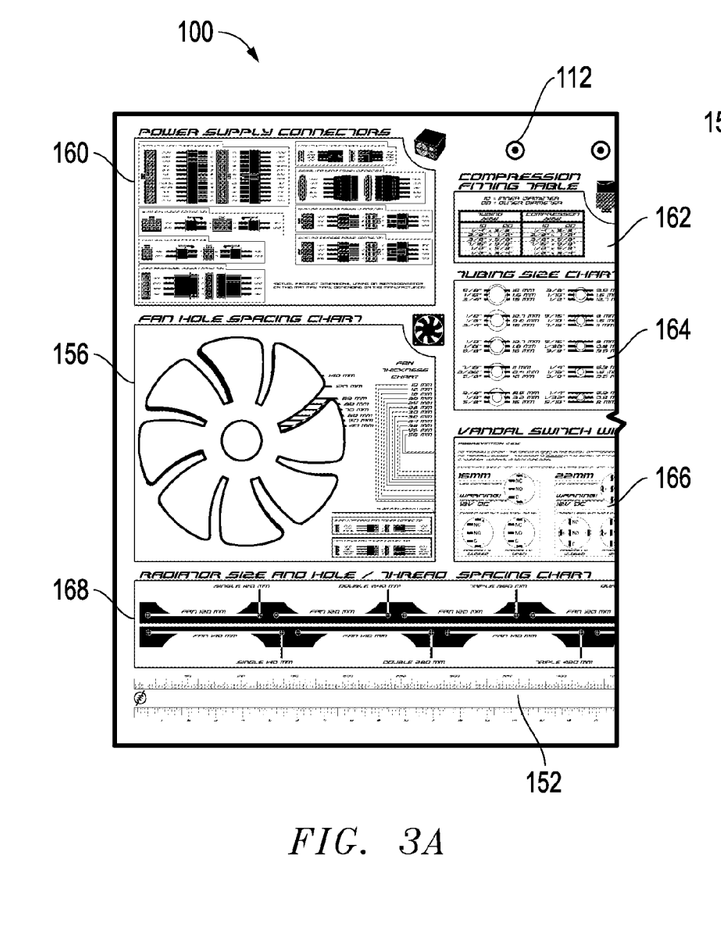
FIG. 3A is a top down view of a portion of the assembly mat shown in FIG. 3, providing further detail of measurement references on the surface of the assembly mat.

Turning to FIG. 3A, a close-up view of a portion of the assembly mat 100 is shown. In FIG. 3A, several of the measurement references 150 may be more clearly seen. For instance, a ruler reference 152 is located along the bottom, with both English and metric units available. Towards the left, a fan hole spacing chart 156 is provided for the system builder to accurately measure the size of a fan to be used, as well as to ensure that the selected fan size will not conflict with other installed components. Wiring references are further provided for connecting the fan to another component, such as the mainboard. The fan hole spacing chart 156 is a second information identifier that clearly references the overall dimensions of a cooling fan. This information allows for quick and localized diagnoses for the proper fan size that needs to be installed. Having this readily available at the system builder's disposal allows for the preservation of the ideal non-removal environment.

In the upper left of the assembly mat 100, a power supply connector reference 160 is provided, which illustrates the various pin connections for the various connectors provided by a computer power supply. For instance, a 24 pin connection for an ATX power connector is provided as are various 4, 6, and 8-pin connectors used for powering the CPU, video card, and other components. The power supply connector reference 160 clearly labels all current connectors required for the proper installation and assembly of a computer power supply into a chassis. These pin-out identifiers allow the system builder to quickly diagnose which connectors are required and at what voltage. Improper installation of these connectors during the assembly process may result in serious injury or death as well as destruction of property. Thus, it is particularly important that a system builder have readily available access to this information at all times. The power supply connector reference 160 includes the industry standard color coding for the actual usage and voltage ranges for all connectors pertaining to the power supply unit. The combination of this information allows the system builder to install a power supply normally or under custom circumstances without disengaging from the ESD protected surface area or grounding strap.

A compression fitting table 162 is provided along the top right portion of the assembly mat 100 as shown in FIG. 3A, which provides tubing sizes and compression sizes for various types of compression fittings. A tubing size chart 164 is also provided which allows a system builder to accurately measure the size of the diameter and circumference of various types of tubing. The compression fitting table 162, tubing size chart 164, and radiator sizing chart 168 allow for a localized reference to specific compatibility dealing with specialized computer cooling solutions that include liquid. Liquids are particularly dangerous to electronic components in conjunction with the danger of ESD, as the liquid may conduct the charge through the system.

Thus, the availability of the measurement references 162, 164, and 168 allow the system builder to properly compare and install the tubing, radiators and other cooling components effectively without leaving the ESD protected environment provided by the assembly mat 100. Disengagement from the grounding strap is eliminated with readily available compatibility and sizing information, thus protecting the components from increased risk of damage.

A vandal switch wiring guide 166 is further provided, which assists the system builder in correctly wiring such electrical switches, if available. Such vandal switches are used on certain computers where they may be subject to theft, tampering, and other vandalism. In particular, the vandal switch wiring guide 166 illustrates the proper wiring diagram for a computer reset and power switch. Installation of these components incorrectly can cause permanent damage and or fatal failure of the electrical circuitry required for the proper usage of a computer. The proper installation is clearly illustrated by the vandal switch wiring guide 166 such that a system builder may correctly integrate the power and reset components without leaving the ESD protected environment. As previously stated, the ability to remain in the protected ESD safe environment lowers the risk of ESD damage and or electric short.

Figure 3B:
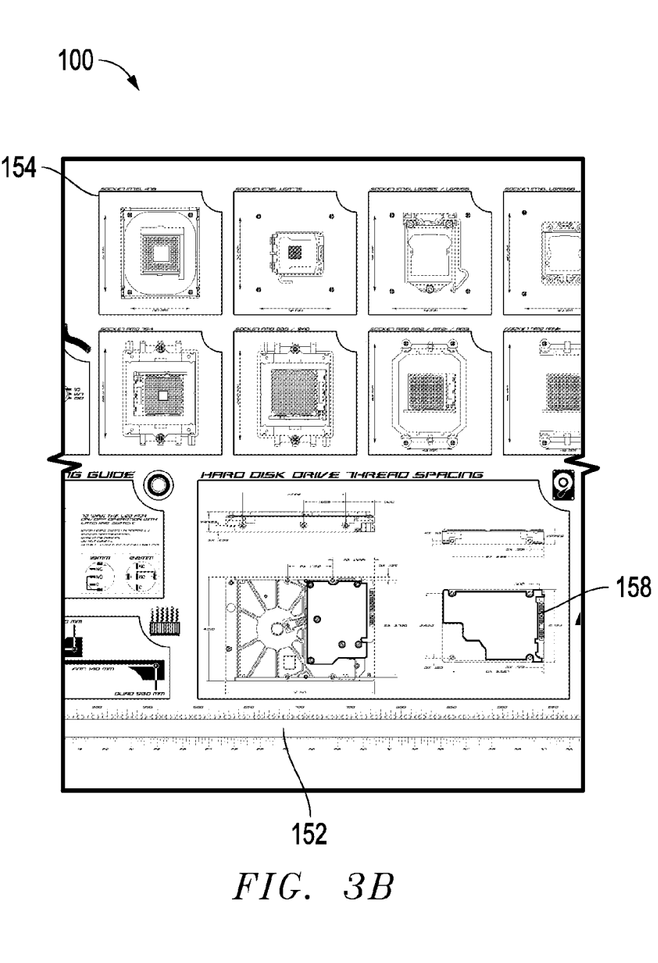
FIG. 3B is a top down view of another portion of the assembly mat shown in FIG. 3, providing further detail of measurement references on the surface of the assembly mat.

Turning next to FIG. 3B, a close-up view of another portion of the assembly mat 100 is shown. In FIG. 3B, additional measurement references 150 are provided, such as a processor (or central processing unit "CPU") socket guide 154 and a hard drive thread spacing guide 158. The CPU socket guide 154 provides the system builder with relative dimensions for various types of CPU sockets utilized by Intel® and AMD®, two common manufacturers of computer processors. The computer processor socket guide 154 allows for the proper combination of compatible hardware. Failure to assemble motherboard and processors in a compatible fashion jeopardizes the success of the assembly. The processor socket guide 154 conveniently provides clearly labeled and scaled identifying graphic references for all current CPU sockets and allows for the proper installation of the electrical devices.

While the protection of all electronic components from ESD is a primary purpose of the assembly mat 100, it is especially important that a computer processor and memory modules be shielded from potentially damaging ESD. Thus, processors and memory modules should be removed from the ESD protected packaging and installed directly onto a mainboard that is ESD protected. The assembly mat 100 features the proper ESD protected surface as well as the necessary information pertaining to overall processor socket compatibility during this phase of assembly. The information provided allows the assembly person to stay in the contained ESD protected work area thus reducing the risk of ESD damage.

The hard drive thread spacing guide 158 provides accurate dimensions for standard 3.5" and 2.5" hard disk drives, including thread spacings. The hard drive spacing chart 158 is available on the assembly mat 100 to associate the proper storage device size information with the proper installation location. A hard disk drive may be easily damaged by any electrostatic discharge and all precautions should be taken to install the device directly from the antistatic wrapped into the hard disk drive mounting location in the computer chassis. The hard disk drive thread spacing chart 158 therefore allows the system builder to proficiently diagnose what drives will be compatible with the current chassis and informs the user of the proper mounting location on the drive itself. This information is important to staying inside the ESD protected area.

Additionally, the ruler measurement 152 seen in FIGS. 3 and 3A are further extended in FIG. 3B. As discussed above, the ruler measurements 152 are provided in both English and metric units. This helps to facilitate any other measurements that need to be conducted without relinquishing the system builder's ESD protected status within the anti-static work area. The ruler measurements 152 may be useful for integration of: electronic optical drives, video card PCB boards, PCI slot expansion boards, and Wi-Fi adapter boards, among other things. All of the above devices are highly susceptible to electrostatic discharge and the risk of damage is lowered with the addition of the imprinted measuring devices on the mat.

The combination of these measurement references 150 reduces the chance of ESD that can cause a wide range of harmful effects as well as failure to electronic components and any integrated circuits contained therein. These components are an important part of the computer assembly process; therefore protection of these units is paramount to the success of the assembly process and the overall completion of the computer. Through use of localized information represented on the surface the assembly mat 100, the system builder significantly lowers the necessity to leave the ESD safe work space thus lowering the failure rate of the assembly itself.

Figure 4:
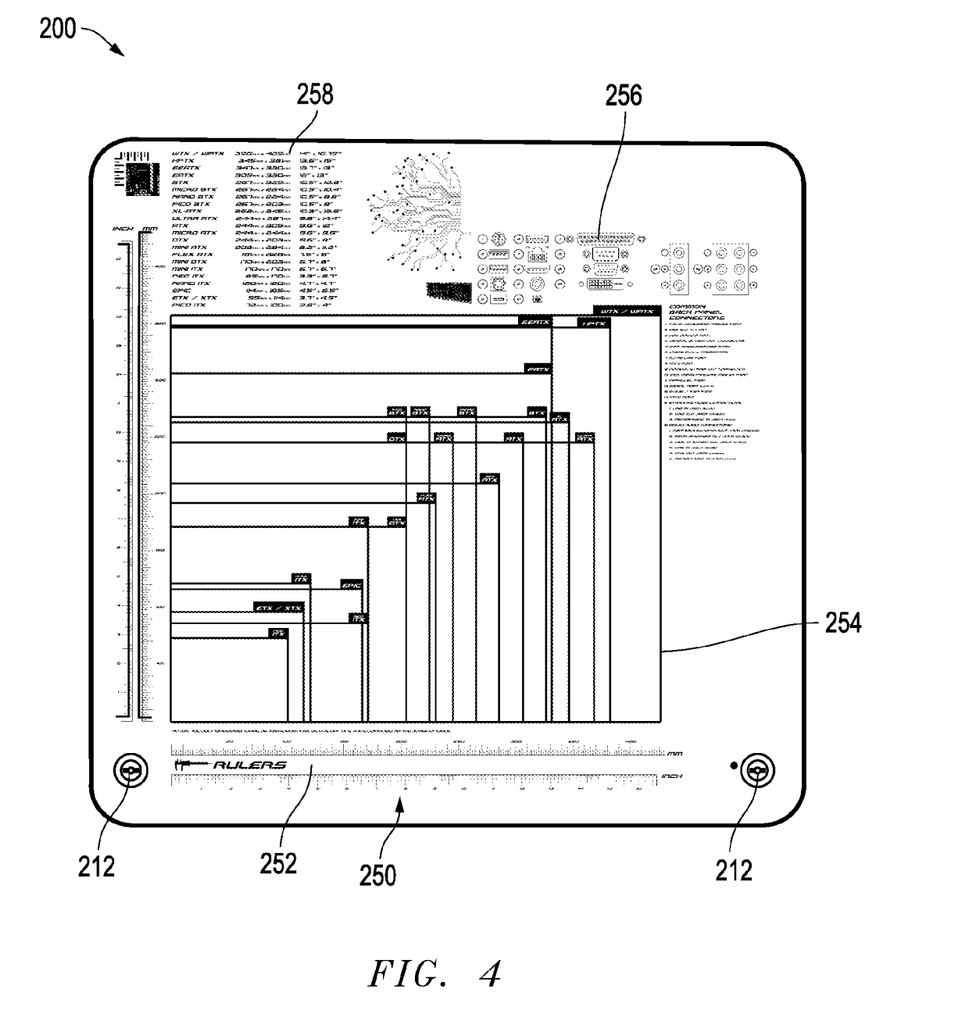
FIG. 4 is a top down view of an assembly mat according to another embodiment of the present invention.

Turning to FIG. 4, another embodiment of the present invention is shown in the form of assembly mat 200. Assembly mat 200 is similarly constructed of an upper and a lower surface made from a flexible anti-static material as with the prior art assembly mat 10 and the assembly mat 100 of the present invention. Assembly mat 200 also includes one or more grounding points 212 as with the previous assembly mat 100. However, unlike the assembly mat 100, the assembly mat 200 is configured primarily for the setup and assembly of computer and electronic components on a mainboard or motherboard, rather than for a computer chassis as is the case with assembly mat 100. Thus, assembly mat 200 is smaller relative to assembly mat 100, and has a different set of measurement references 250 from assembly mat 100. Some measurement references 250 may be similar or be otherwise in common with the measurement references 150.

For instance, assembly mat 200 includes a ruler 252 which contains both English and metric units, as in assembly mat 100. However, assembly mat 200 may additionally include different measurement references 250, such as a mainboard sizing chart 254, a mainboard connector chart 256, and a mainboard dimension table 258.

Figure 4A:
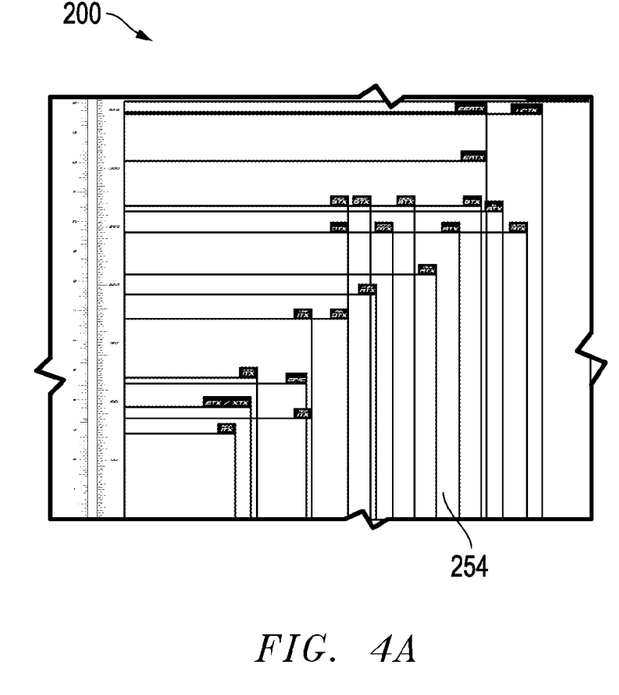
FIG. 4A is a top down view of a portion of the assembly mat shown in FIG. 4, providing further detail for measurement references shown on the surface of the assembly mat.

Turning to FIG. 4A, a portion of the assembly mat 200 is shown in greater detail. In this figure, the mainboard sizing chart 254 may be more clearly seen providing the exact sizing for a wide variety of mainboard sizes, such as the various iterations of ITX and ATX mainboards. Using this sizing chart, a system builder may be able to accurately identify and size the mainboard that he/she will be working to assemble.

Figure 4B:
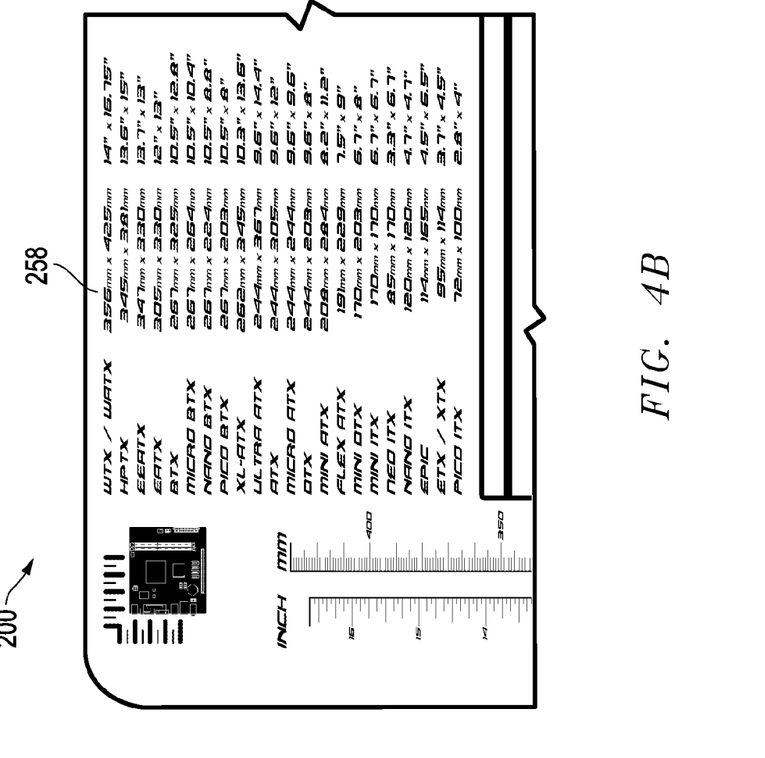
FIG. 4B is a top down view of another portion of the assembly mat shown in FIG. 4, providing further detail for the measurement references shown on the surface of the assembly mat.

Next at FIG. 4B, the mainboard dimension table 258 is shown in greater detail. The mainboard dimension table 258 is useful for providing a system builder with relative measurements of the dimensions for the variety of mainboards available, and provides a quick reference as to the relative sizes of the mainboards as compared to other system components, such as video cards and other expansion cards. By understanding the sizes of the various components, component conflict may be planned and more easily avoided during the assembly process. By way of example only, a system builder may be able to study the dimensions of the mainboard and calculate how much tolerance he/she has in the length and height of a video card to be installed. Then, the appropriately sized video card may be purchased without risk of purchasing a video card having dimensions that would physically conflict with the mainboard or computer chassis.

Returning briefly to FIG. 4, the mainboard connector chart 256 is provided as a reference for a system builder during the assembly process, and includes scale figures of the various types of computer connectors found on a mainboard such as USB, PS2, firewire, eSATA, DVI, serial and parallel ports, and LAN connectors. By providing scale figures of the connectors for a mainboard, a system builder may easily identify what connectors are available for a particular mainboard, as well as troubleshoot any potential problems with the connections during the assembly process.

The assembly mat 200 provides for many of the same benefits found on the assembly mat 100, including providing a non-removal environment for the system builder, as well as anti-static and physical protection for system components laid on the surface of the mat 200. However, it will be recognized that assembly mat 200 provides a different set of measurement references 250, which are more specifically tailored to the process of building up components for a mainboard rather than an overall computer system build. Additional embodiments of the assembly mats of the present invention are also contemplated, with such assembly mats supporting different sets of measurement references as well as mat sizes and placement of the references.

It will be readily apparent to those skilled in the art that the general principles defined herein may be applied to other embodiments and applications without departing from the spirit and scope of the present invention. Having thus described the exemplary embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is contemplated that the appended claims will cover any such modifications or embodiments that fall within the true scope of the invention.

What is claimed is:

1. An electronic component assembly mat comprising:
An upper flexible surface and a lower flexible surface, the surfaces made from a non-conductive material;
one or more grounding connectors extending above the upper surface;
an anti-static wrist strap connectable to the grounding connector; and,
a plurality of measurement guides located on the upper surface, the measurement guides comprising:
 a ruler measurement;
 a power supply connector overview;
 a processor socket layout;
 a hard disk drive thread spacing diagram;
 a fan hole spacing chart;
 a radiator size and hole spacing chart;
 a tubing and compression fitting compatibility table; and,
 a tubing size chart.

2. The assembly mat of claim 1, the measurement guides further comprising:
a vandal resistant switch wiring guide.

3. The assembly mat of claim 1, the upper surface comprised of a durable non-scratch material.

4. The assembly mat of claim 1, the lower surface comprised of a durable non-scratch material.

5. The assembly mat of claim 1, the lower surface comprised of a material having a coefficient of friction greater than 1.0 as to between the lower surface and a surface having the same material.

6. The assembly mat of claim 1 further comprising a grounding cable attached between one of the grounding connectors located on the upper surface and a grounded location on an electronic component.

7. The assembly mat of claim 1 further comprising a grounding cable attached between one of the grounding connectors located on the upper surface and a grounded electrical outlet.

8. The assembly mat of claim 1, the upper surface having dimensions sufficient for placing a plurality of computer components simultaneously on the mat.

9. A motherboard assembly mat comprising:
an upper flexible surface and a lower flexible surface, the surfaces made from a non-conductive material;
one or more grounding connectors extending above the upper surface;
an anti-static wrist strap connectable to the grounding connector; and,
a plurality of measurement guides located on the upper surface, the measurement guides comprising:
 a ruler measurement;
 a motherboard sizing chart; and
 a motherboard connector reference chart.

10. The assembly mat of claim 9, the upper surface comprised of a durable, non-scratch material.

11. The assembly mat of claim 9, the lower surface comprised of a durable, non-scratch material.

12. The assembly mat of claim 9, the upper and lower flexible surfaces comprising a latex rubber material.

13. The assembly mat of claim 9, the motherboard sizing chart further comprising:
a motherboard sizing table.

14. The assembly mat of claim 9 further comprising a grounding cable attached between one of the grounding connectors located on the upper surface and a grounded location on an electronic component.

15. The assembly mat of claim 9 further comprising a grounding cable attached between one of the grounding connectors located on the upper surface and a grounded electrical outlet.

* * * * *